(12) United States Patent
Cho et al.

(10) Patent No.: US 10,811,552 B2
(45) Date of Patent: *Oct. 20, 2020

(54) SOLAR CELL HAVING WAVELENGTH CONVERTING LAYER AND MANUFACTURING METHOD THEREOF

(71) Applicant: Korea Institute of Science and Technology, Seoul (KR)

(72) Inventors: So Hye Cho, Seoul (KR); Il Ki Han, Seoul (KR); Doo Hyun Ko, Seoul (KR); Joon Soo Han, Seongnam-si (KR); Bok Ryul Yoo, Seoul (KR); Seung Yong Lee, Gwacheon-si (KR); Hyungduk Ko, Seoul (KR); Joon-Suh Park, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 42 days.

This patent is subject to a terminal disclaimer.

(21) Appl. No.: 14/607,621

(22) Filed: Jan. 28, 2015

(65) Prior Publication Data

US 2015/0364632 A1 Dec. 17, 2015

(30) Foreign Application Priority Data

Jun. 16, 2014 (KR) .................. 10-2014-0072997

(51) Int. Cl.
*H01L 31/055* (2014.01)
*H01L 31/077* (2012.01)
(Continued)

(52) U.S. Cl.
CPC ............ *H01L 31/055* (2013.01); *C09K 11/06* (2013.01); *C09K 11/7773* (2013.01);
(Continued)

(58) Field of Classification Search
CPC ......... H01L 31/02322; H01L 31/03928; H01L 31/055; H01L 31/0232; H01L 31/054
See application file for complete search history.

(56) References Cited

U.S. PATENT DOCUMENTS 6,534,184 B2 * 3/2003 Knasiak ............... C08G 77/42
428/447
2003/0099843 A1 * 5/2003 Aoki .................... C09D 183/16
428/446

(Continued)

FOREIGN PATENT DOCUMENTS

JP 2001-36107 A 2/2001
JP 2010-186845 A 8/2010

(Continued)

OTHER PUBLICATIONS

Kozuka, et al., "Polysilazane as the source of silica: the formation of dense silica coatings at room temperature and the new route to organic—inorganic hybrids." Journal of Sol-Gel Science and Technology, 48.1-2 (2008): 148-155.*

(Continued)

*Primary Examiner* — William E McClain
(74) *Attorney, Agent, or Firm* — NSIP Law

(57) ABSTRACT

The present invention relates to a solar cell having a wavelength converting layer formed of a polysilazane and a manufacturing method thereof to allow for low temperature sintering, to protect a wavelength converter from oxidation, degradation, and whitening, and thereby improve efficiency of the solar cell. The present invention provides for the solar cell including the wavelength converting layer which is formed by applying a coating solution containing a solvent, a polysilazane, and a wavelength converter onto a cell and an outer surface or inside of the cell, and then curing, and a manufacturing method of.

20 Claims, 11 Drawing Sheets

(51) Int. Cl.
*H01L 31/0749* (2012.01)
*H01L 31/0216* (2014.01)
*C09K 11/77* (2006.01)
*C09K 11/06* (2006.01)

(52) U.S. Cl.
CPC ...... *C09K 11/7774* (2013.01); *C09K 11/7787* (2013.01); *H01L 31/02168* (2013.01); *H01L 31/077* (2013.01); *H01L 31/0749* (2013.01); *C09K 2211/1007* (2013.01); *C09K 2211/1044* (2013.01); *C09K 2211/1088* (2013.01); *Y02E 10/52* (2013.01); *Y02E 10/541* (2013.01)

(56) References Cited

U.S. PATENT DOCUMENTS

| | | | | |
|---|---|---|---|---|
| 2007/0267058 A1* | 11/2007 | Naum | ............... | H01L 31/055 136/255 |
| 2009/0071539 A1* | 3/2009 | Choi | ............... | B82Y 20/00 136/258 |
| 2009/0084963 A1* | 4/2009 | Kost | ............... | H01L 31/02168 250/370.01 |
| 2009/0269569 A1* | 10/2009 | Fucsko | ............... | H01L 21/316 428/220 |
| 2010/0108136 A1* | 5/2010 | Ding | ............... | C03C 14/006 136/256 |
| 2010/0126566 A1* | 5/2010 | Ji | ............... | G02F 2/02 136/252 |
| 2010/0126567 A1* | 5/2010 | Kaufman | ............... | H01L 31/035227 136/252 |
| 2010/0139748 A1* | 6/2010 | Ding | ............... | C03C 3/095 136/255 |
| 2010/0159255 A1* | 6/2010 | Lee | ............... | C09D 183/04 428/447 |
| 2010/0163104 A1* | 7/2010 | Tseng | ............... | H01L 31/022425 136/256 |
| 2010/0218827 A1* | 9/2010 | Aono | ............... | C25D 11/02 136/264 |
| 2010/0313940 A1* | 12/2010 | Wehrspohn | ............... | H01L 31/055 136/254 |
| 2011/0126889 A1* | 6/2011 | Bourke, Jr. | ............... | H01L 31/055 136/253 |
| 2011/0278616 A1* | 11/2011 | Washizu | ............... | H05B 33/10 257/98 |
| 2012/0006403 A1* | 1/2012 | Rode | ............... | C08G 77/62 136/256 |
| 2012/0017985 A1* | 1/2012 | Rode | ............... | C08G 77/62 136/256 |
| 2012/0024345 A1* | 2/2012 | Reisfeld | ............... | H01L 31/055 136/247 |
| 2012/0031486 A1* | 2/2012 | Parce | ............... | H01L 31/02168 136/256 |
| 2013/0042914 A1* | 2/2013 | Chan | ............... | H01L 31/056 136/257 |
| 2013/0059109 A1* | 3/2013 | Kretschmann | ............... | C08L 83/04 428/76 |
| 2013/0098438 A1* | 4/2013 | Kawai | ............... | H01L 31/055 136/256 |
| 2014/0106576 A1* | 4/2014 | Morita | ............... | C08G 77/62 438/787 |
| 2015/0353417 A1* | 12/2015 | Mori | ............... | C03C 17/007 359/599 |
| 2016/0115378 A1* | 4/2016 | Ezure | ............... | C09K 11/02 252/301.36 |

FOREIGN PATENT DOCUMENTS

JP 2010-258293 A 11/2010
JP 2013-69726 A 4/2013

OTHER PUBLICATIONS

Günthner, et al., "High emissivity coatings based on polysilazanes for flexible Cu (In, Ga) Se 2 thin-film solar cells." Solar Energy Materials and Solar Cells, 123 (2014): 97-103.*

Riedel, Ralf, et al., "Silicon-based polymer-derived ceramics: synthesis properties and applications—a review." Journal of the Ceramic Society of Japan, 114.1330 (2006): 425-444.*

Lukacs, A. "Polysilazane precursors to advanced ceramics." Am Ceram Soc Bull, 86.1 (2007): 9301-9306.*

Bauer, et al. "Preparation of moisture curable polysilazane coatings: Part I. Elucidation of low temperature curing kinetics by FT-IR spectroscopy." Progress in organic coatings, 53.3 (2005): 183-190.*

Nakada, et al. "Novel device structure for Cu(In,Ga)Se2 thin film solar cells using transparent conducting oxide back and front contacts." Solar energy 77.6 (2004): 739-747.*

Korean Office Action dated Feb. 22, 2015 in counterpart Korean Patent Application No. 10-2014-0072997 (5 pages, in Korean).

* cited by examiner

Under Natural Light

Under 365nm Ultraviolet Light (a)    (b)

SOLAR CELL HAVING WAVELENGTH CONVERTING LAYER AND MANUFACTURING METHOD THEREOF

CROSS-REFERENCE TO RELATED APPLICATION

This application claims priority to and the benefit of Korean Patent Application No. 10-2014-0072997 filed in the Korean Intellectual Property Office on Jun. 16, 2014, the entire contents of which are incorporated herein by reference.

TECHNICAL FIELD

The present invention relates to a solar cell and a method of manufacturing the same, and more particularly, to a solar cell having a wavelength converting layer formed of a polysilazane which converts a wavelength area incapable of contributing to a photoelectric effect to a wavelength capable of contributing to the photoelectric effect, and a method of manufacturing the same.

BACKGROUND

Due to the continuous rise of oil prices and distrust of nuclear energy safety, sunlight is receiving the spotlight as an energy source. Recently, according to a framework convention on climate change (FCCC) which is an international treaty, a requirement for the reduction of greenhouse gas emissions and renewable portfolio standard (RPS) have been mentioned, and at the same time, technology for increasing solar cell efficiency using research on solar energy which is pollution-free and unlimited are being developed, and technology for increasing competitiveness and economic efficiency have been receiving attention.

In the solar cell, a main problem limiting theoretical efficiency is an mismatching between incident sunlight spectrum and an absorption spectrum of the solar cell. While sunlight has a wide range of wavelengths from infrared light to ultraviolet light, the solar cell generally absorbs and photoelectrically converts only a portion of visible light. Accordingly, infrared light light in sunlight is passed through without being absorbed by the solar cell and is lost, and ultraviolet light is lost by heat. For example, in the case of the solar cell of a silicon material, theoretical efficiency is about 30%, heat loss is about 33%, and transmission loss is about 20%.

Recently, research to improve efficiency of the solar cell by minimizing loss due to spectrum mismatch has been proposed. Particularly, the use of a wavelength converter which absorbs and converts sunlight into an absorption area of the solar cell has received much attention. That is, to go beyond the theoretical efficiency of the solar cell, a technique of converting sunlight has been proposed.

In the technique of converting sunlight, the production of the transparent wavelength conversion layer which may absorb light in the wavelength area which is not absorbed and is lost on the solar cell and performs wavelength conversion, and may transmit light in the wavelength area which may be absorbed by the solar cell with is required. The above-described wavelength conversion layer may be formed by evenly dispersing a wavelength converter on a surface of the cell.

However, since the existing wavelength conversion layer includes a wavelength converter, and an organic polymer resin, for example, an epoxy (—C—O—C—)-based or silicone (—C—O—Si—C—)-based resin supporting the wavelength converter, high transmittance of 90% or more is not ensured in a visible light area in which the solar cell mainly functions, and yellowing is generated and transmittance gradually decreases upon prolonged exposure to sunlight.

Further, when the wavelength conversion layer is produced using the above-described organic polymer resin, heat resistance is low, penetration by gas and water in the atmosphere may not be prevented, and thus there is a problem in that the wavelength converter supported by the organic polymer resin may not be stably protected from heat, oxygen, water, etc.

In order to resolve the above-described problems, the use of an inorganic thin film such as glass and silica ($SiO_2$) is being proposed as a material supporting a wavelength converter. However, in the case of the above-described inorganic thin film, sintering at high temperature of 700° C. or more is required, and a problem such as modification or cracking of a substrate of a solar cell may occur in the sintering process.

Further, in order to resolve the problem of high temperature sintering of the inorganic thin film, sol-gel silica may be used using a silica precursor, for example, tetraethyl orthosilicate (TEOS). In this case, in a gelation process of a sol precursor, significant volume shrinkage, for example 30% or more, is accompanied by cracking which leads to partial defects, and thus, a special operation such as press sintering or the like is required to produce a thin film having high transmittance. Korean Patent Registration No. 10-1091707, Published on Dec. 2, 2011 Korean Laid-open Patent Publication No. 2013-0081088, Published on Jul. 16, 2013

SUMMARY

Accordingly, an objective of the present invention is directed to providing a solar cell having a wavelength converting layer formed of a polysilazane which allows for low temperature sintering, and a method of manufacturing the same.

Another objective of the present invention is directed to providing a solar cell having a silica-based inorganic wavelength converting layer capable of protecting a wavelength converter from oxidation, degradation, and whitening and a method of manufacturing the same.

Still another objective of the present invention is directed to providing a solar cell having a silica-based inorganic wavelength converting layer which may improve efficiency of the solar cell by converting a wavelength area incapable of contributing to a photoelectric effect to a wavelength capable of contributing to the photoelectric effect and a method of manufacturing the same.

In order to accomplish the objective, one aspect of the present invention provides a solar cell which includes a wavelength converting layer formed on an outer surface or inside of the cell, and containing a silica-based inorganic material and a wavelength converter.

In the solar cell according to an embodiment of the present invention, the wavelength converting layer may be formed on a sunlight incident surface or back surface of the cell.

In the solar cell according to the embodiment of the present invention, the cell may include a substrate, a back electrode layer formed on the substrate, a light absorbing layer formed on the back electrode layer, a buffer layer formed on the light absorbing layer, and a transparent front electrode layer formed on the buffer layer. Here, the wavelength converting layer may be formed at one or more of a position between the light absorbing layer and the buffer layer, a position between the buffer layer and the front electrode layer, a position on the front electrode layer, and an upper or lower surface of the substrate.

In the solar cell according to the embodiment of the present invention, the silica-based inorganic material may be represented by the following Formula 1.

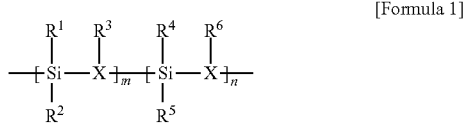
[Formula 1]

(m and n are integers from 1 to 500, $R_1$, $R_2$, $R_4$ and $R_5$ are hydrogen, a methyl group, a vinyl group or a phenyl group, $R_3$ and $R_6$ are hydrogen, a trimethylsilyl or alkoxysilylpropyl, each R may be identical or different, X is oxygen or nitrogen, and nitrogen in a range of 0.00001 to 0.5 times of oxygen.

In the solar cell according to the embodiment of the present invention, content of the wavelength converter in the wavelength converting layer may be in the range of 0.0001 to 50 wt %, preferably in the range of 0.001 to 20 wt %, and more preferably in the range of 0.01 to 10 wt % with respect to a total weight of the wavelength converting layer.

In the solar cell according to the embodiment of the present invention, the wavelength converter may include a lanthanum-based compound or a transition metal compound. Here, the lanthanum-based compound and transition metal compound may include a nitric acid-based compound, a carbonic acid-based compound, a halogen-based compound, a sulfuric acid-based compound, an oxide-based compound, a phosphoric acid-based compound, an acetate-based compound, an acetoacetyl-based compound or a coordinate bonded organic compound-based compound.

In the solar cell according to the embodiment of the present invention, the wavelength converter may include an organic light emitting material. Here, the organic light emitting material may include one or more types selected from the group consisting of an organic monomer including an aromatic, an alicyclic, an ether, a halogenated hydrocarbon, or a terpene functional group and a polymer thereof.

In the solar cell according to the embodiment of the present invention, the wavelength converter may include a semiconductor nanocrystal having a particle size of 2 to 40 nm Here, the semiconductor nanocrystal may include one or more types selected from the group consisting of CdTe/CdSe, CdS(Se)/CdTe, CdS(Se)/ZnTe, CuInS(Se)/ZnS(Se), Cu(GaIn)S(Se)/ZnS(Se), ZnTe/CdS(Se), GaSb/GaAs, GaAs/GaSb, Ge/Si, Si/Ge, PbSe/PbTe, PbTe/PbSe, CdTe, CdSe, ZnTe, $CuInS_2$, $CuGaS_2$, $Cu(Ga,In)S_2$, CuGaSnS(Se), CuGaS(Se), CuSnS(Se), ZnS, $CuInSe_2$, $CuGaSe_2$, ZnSe, ZnTe, GaSb, GaAs, Ge, Si, PbSe, PbTe, PbTe, and PbSe.

In the solar cell according to the embodiment of the present invention, the wavelength converter may include an inorganic phosphor powder. Here, the inorganic phosphor powders may include an oxide-based powder, a halogen-based powder, a nitrogen-based powder or a silicate-based powder.

Further, another aspect of the present invention provides a method of manufacturing the solar cell including preparing a cell, forming a wavelength converting layer by applying a coating solution containing a solvent, a polysilazane, and a wavelength converter onto at least one surface of the cell, and then curing the wavelength converting layer.

In the method of manufacturing the solar cell according to the embodiment of the present invention, in the forming of the wavelength converting layer, the wavelength converting layer may be formed on a sunlight incident surface of the cell.

In the method of manufacturing the solar cell according to the embodiment of the present invention, the solvent of the coating solution may include a petroleum solvent, an aromatic solvent, an alicyclic solvent, ether, a halogenated hydrocarbon, a terpene mixture or a mixture thereof.

In the method of manufacturing the solar cell according to the embodiment of the present invention, the coating solution may further include a curing catalyst, a binder, and metal particles. Here, total content of the curing catalyst, binder and metal particles may be in the range of 0.0001 to 10 wt % with respect to the coating solution.

In the method of manufacturing the solar cell according to the embodiment of the present invention, in the forming of the wavelength converting layer, curing may be performed using a method of heating, irradiating light, arranging at room temperature, injecting water, or injecting a catalyst.

In the method of manufacturing the solar cell according to the embodiment of the present invention, the forming of the wavelength converting layer may include forming a first thin film by applying a coating solution having a first composition and then curing, and forming a second thin film by applying a coating solution having a second composition which is different from the first composition onto the first thin film and then curing.

Further, in the method of manufacturing the solar cell according to the embodiment of the present invention, one of the first and second thin films may have a regularly arranged pattern, and the regularly arranged pattern may have a thickness of several tens of nanometers to several millimeters.

DETAILED DESCRIPTION

Figure 1:
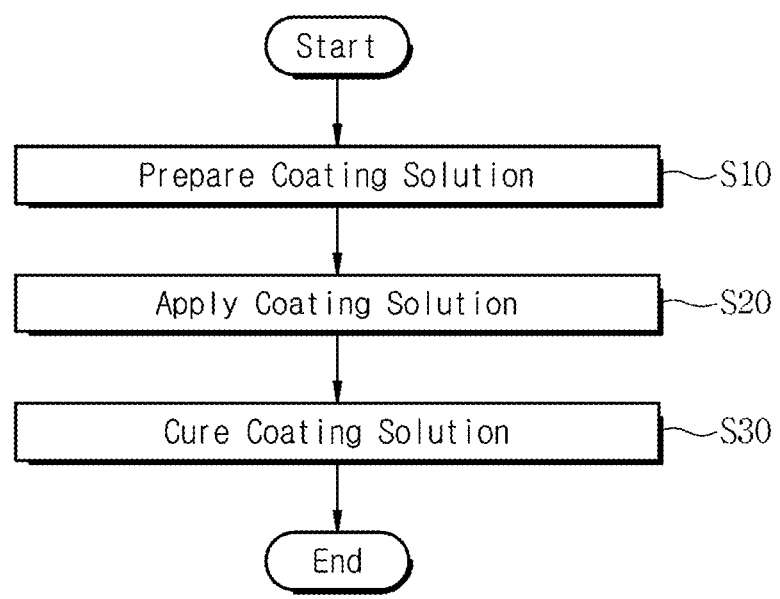
FIG. 1 is a schematic view showing a process of forming a wavelength converting layer of a solar cell according to an embodiment of the present invention.

It should be noted that only the part necessary to help understanding of an example of the present invention is described in the following description, and another part will be omitted such that the substance of the present invention is clear.

The terminology or word used in the present specification and claims should not be restrictively interpreted as the general or dictionary meaning, and should be interpreted as the meaning and concept corresponding to the technical idea on the basis that the inventors may suitably define the concept of the term to describe their invention with the best method. Accordingly, the examples described in the present specification and the composition illustrated in the drawings are merely preferable examples of the present invention, and does not represent all of the technical idea of the present invention, and thus, it should be understood that there are various equivalents and modifications which may substitute therefor.

Hereinafter, examples of the present invention will be described in detail in conjunction with the accompanying drawings.

The present invention provides a transparent coating composition for converting wavelength including a polysilazane which has high light transmittance, allows for low temperature sintering, and shows little volume shrinkage upon curing.

FIG. 1 is a schematic view showing a process of forming a wavelength converting layer of a solar cell according to an embodiment of the present invention.

Referring to FIG. 1, a coating composition (coating solution) is prepared by mixing a solvent, polysilazane, a wavelength converter, a catalyst and/or a binder, metal particles and performing ultrasonification thereon in step S10.

Next, the coating composition is applied onto a substrate in step S20.

Then, in step S30, a wavelength converting layer in a thin film or sheet form may be formed by curing the applied coating composition. Here, the wavelength converting layer in the thin film form is referred to as a wavelength converting thin film, and the wavelength converting layer in the sheet form is referred to as a wavelength converting sheet.

The coating composition according to an embodiment of the present invention is a coating solution including a solvent, a polysilazane, and a wavelength converter.

Here, as the solvent, a petroleum solvent, an aromatic solvent, an alicyclic solvent, ether, a halogenated hydrocarbon, a terpene mixture, or a combination thereof may be used. The solvent may be mixed in the range of 1 to 99 wt % with respect to a total weight of the coating composition and used. Content of the solvent may be suitably adjusted according to a thickness and a coating method of the thin film/sheet to be formed, when content of the solvent is less than 1 wt %, there is the risk of fire due to an excessive reaction of a coating solution with water upon exposure to water, and when content of the solvent is more than 99.9 wt %, the formed thin film/sheet is too thin, and thus an effective wavelength converting effect may not occur.

The polysilazane may be represented by Formula 1.

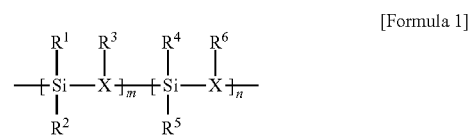

[Formula 1]

(m and n are integers from 1 to 500, $R_1$, $R_2$, $R_4$ and $R_5$ are hydrogen, a methyl group, a vinyl group or a phenyl group, $R_3$ and $R_6$ are hydrogen, a trimethylsilyl or alkoxysilylpropyl)

Content of the polysilazane is preferably in the range of 1 to 99 wt % with respect to a total coating composition.

The polysilazane is a polymer compound ($[-SiR_2-NR-]_n$) including nitrogen and silicon. The polysilazane is oxidized at a low temperature of 200° C. or less by an external stimulus such as heat, water, a catalytic reaction, light, or the like, and nitrogen is partially or fully substituted with oxygen to be modified into a silica-based material $[-SiR_2-XR-]_n$ (X=oxygen or a mixture of oxygen and nitrogen) in the oxidation process. The silica-based inorganic material which is a cured material has excellent transmittance, volume shrinkage thereof is small in a curing process, and thus has less modification or cracking occurrence in a substrate. Primary-cured material may be completely oxidized using a method of high temperature sintering, adding a catalyst, injecting water or oxygen, or the like, to be modified into pure silica.

The above-described silica-based inorganic material is represented by Formula 1, where, m and n are integers from 1 to 500, $R_1$, $R_2$, $R_4$ and $R_5$ are hydrogen, a methyl group, a vinyl group or a phenyl group, $R_3$ and $R_6$ are hydrogen, a trimethylsilyl or alkoxysilylpropyl, each R may be identical or different, X is oxygen or nitrogen, and nitrogen is in a range of 0.00001 to 0.5 times of oxygen. In the present aspect, the reason for using the coating composition including the polysilazane to prepare the wavelength converting sheet or the wavelength converting layer in the thin film form is as follows. This is because the wavelength converting layer formed of the polysilazane has high light transmittance, excellent heat resistance and chemical resistance, low water and oxygen permeability, no yellowing, and thus has less photobleaching even upon prolonged exposure to a light source such as sunlight, a lighting device, or the like, and the decrease in light emitting efficiency is also small. Particularly, a polysilazane solution has very high visible light penetrability of 80% or more, and has high solubility or dispersity with respect to a material such as an organic compound, a lanthanum-based compound and a transition metal compound, a semiconductor nanocrystal, an inorganic nano-phosphor, or the like, and thus high transparency may be maintained even when the solution is mixed with the above-described materials. Further, when the thin film or the sheet is prepared by applying the mixture to a base material, the thin film or the sheet may maintain high transparency.

The wavelength converter includes a down converter and an up converter, the down converter may convert high energy light into low energy light, and on the other hand, the up converter may convert low energy light into high energy light. Examples of the above-described wavelength converter may include the organic light emitting material, the lanthanum-based compound and transition metal compound, the semiconductor nanocrystal, and the inorganic nanophosphor powders.

Here, as the organic light emitting material, organic monomer including an aromatic, an alicyclic, an ether, a halogenated hydrocarbon, or a terphene functional group may be used, and a polymer thereof may also be used. Further, a combination thereof may also be used. Specifically, examples of the above-described organic light emitting material may include coumarin, a rhodamine, a porphyrin, fluorescein, Lumogen, cyanomethylene, or the like, and one or more types thereof may be used.

As the lanthanide element, one or more elements of Ce, Pr, Nd, Sm, Eu, Gd, Tb, Dy, Ho, Er, Tm, and Yb may be used. As the transition metal element, one or more elements of Sc, Ti, V, Cr, Mn, Fe, Co, Ni, Cu, and Zn may be used. Examples of supply sources of the above-described lanthanide and transition metal element ion may include a nitric acid-based compound, a carbonic acid-based compound, a halogen-based compound, a sulfuric acid-based compound, an oxide-based compound, a phosphoric acid-based compound, an acetate-based compound, an acetoacetyl-based compound, or a coordinate bonded organic compound-based compound.

As the semiconductor nanocrystal, a semiconductor nanocrystal having a core/shell structure such as CdTe/CdSe, CdS(Se)/CdTe (Here, CdS(Se) denotes that a portion of S of CdS is substituted with Se, and a sum of S and Se is equivalent to 1), CdS(Se)/ZnTe, CuInS(Se)/ZnS(Se), Cu(GaIn)S(Se)/ZnS(Se), ZnTe/CdS(Se), GaSb/GaAs, GaAs/GaSb, Ge/Si, Si/Ge, PbSe/PbTe, PbTe/PbSe, or the like may be used (Here, CdTe/CdSe denotes that CdTe is present in a core, and CdSe is present in a shell). Further, a semiconductor nanocrystal including CdTe, CdSe, ZnTe, $CuInS_2$, $CuGaS_2$, $Cu(Ga,In)S_2$, CuGaSnS(Se), CuGaS(Se), CuSnS(Se), ZnS, $CuInSe_2$, $CuGaSe_2$, ZnSe, ZnTe, GaSb, GaAs, Ge, Si, PbSe, PbTe, PbTe, and PbSe may be used. Further, a combination thereof may be used. A size of the semiconductor nanocrystal is preferably in the range of 2 to 40 nm.

As the inorganic phosphor powder, an oxide-based powder, a sulfide-based powder, an aluminum-based powder, a halogen-based powder, a nitrogen-based powder, and a silicate-based powder may be used. Examples of materials of the above-described inorganic phosphor powder may include, for example, $(AE)Ga_2S_4:Eu^{2+}$, $(AE)S:Eu^{2+}$, $(AE)M_2O_4:Eu^{2+}$ (AE which is an alkaline earth metal is at least one of Ba, Ca, and Sr, and M is at least one of Si, Al, and Ge), $Y_3Al_5O_{12}:Ce^{3+}$ (hereinafter, called YAG), $SrAl_2O_4:Eu$; Dy, $LaPO_4:Eu$, $LaVO_4:Eu$, $NaYF_4:Er;Yb$, $NaYF_4:Tm;Yb$, ZnO, $Y_2O_3:Eu$ (and/or Tb), $CaSiAlN_3$, $SrSN_2$, or the like, and one or more types thereof may be used.

The above-described wavelength converters may be mixed in the range of 0.0001 to 50 wt % with respect to a total weight of the coating composition and used. When the wavelength converter is less than 0.0001 wt %, wavelength converting efficiency is decreased, and thus the wavelength converter is difficult to be applied as the wavelength converting sheet, and when the wavelength converter is more than 50 wt %, a high quality cured layer is difficult to obtain, and high light transmittance may be decreased.

An additive may be further contained in the coating composition according to the present aspect. As the additive, a curing catalyst, a binder, metal particles, or a combination thereof may be used.

Here, the curing catalyst promotes curing of the coating composition at a temperature of 200° C. or less, and thereby serves to help a curing process converting the polysilazane into silica. As the representative curing catalyst, there are an organic base catalyst and a metal catalyst.

Examples of the organic base catalysts may include amines such as N,N'-trimetylenebis(1-methylpiperidine), bis(2-dimethylaminoethyl)ether, N,N'-dimethylpiperazine, 4-(dimethylamino)pyridine, N,N'-dimethylcyclohexylamine, N,N-dimethylbenzylamine, N,N,N',N',N''-pentamethyldiethylenetriamine, N,N-dimethylcetylamine, trihexylamine, triethylamine, ethylenediamine, etc. One or a combination thereof may be used. The organic base catalyst may be mixed in the range of 0.1 to 5 wt % with respect to the total coating composition and used. When the organic base catalyst is less than 0.1 wt %, catalytic activity may be decreased, and when the organic base catalyst is more than 5 wt %, transmittance of the wavelength converting layer may be decreased.

As the metal catalyst, an organic acid complex, an inorganic acid complex, or an organic metal compound including a metal such as palladium, platinum, rhodium, nickel, iridium, ruthenium, osmium, cobalt, or the like may be used. Further, a metal particle or a precursor capable of forming the metal particle may be used as the metal catalyst. The metal catalyst may be mixed in the range of 0.01 to 1 wt % with respect to the total coating composition and used. When content of the metal catalyst is less than 0.01 wt %, catalytic activity may be decreased, and when content of the metal catalyst is more than 1 wt %, light transmittance of the wavelength converting layer may be decreased.

Adhesion between the base material and curing agent may be improved by a binder, and examples of the binders may include 3-aminopropyl(triethoxysilane), N-(2-aminoethyl)-3-aminopropyltriethoxysilane, N-(3-ethoxysilylpropyl)-4,5-dihydroimidazole, 3-aminopropyl(methyldiethoxysilane), vinyltriethoxysilane, trifluoropropyltrimethoxysilane, cyanoethyltrimethoxysilane, methacryloylpropyltriethoxysilane, (3-acryloylpropyl)trimethoxysilane, vinyltriethoxysilane, 3-isocyanatopropyltriethoxysilane, or a combination thereof. The binder is preferably mixed in the range of 0.1 to 5 wt % with respect to the total coating composition and used. When the binder is less than 0.1 wt %, adhesion between the base material and curing agent is not improved, and when the binder is more than 5 wt %, light transmittance of the wavelength converting layer may be decreased, or the high quality thin film is difficult to form.

Metal particles are used with the wavelength converter, and serve to increase wavelength converting efficiency of the wavelength converter. This results from the metal particles amplifying light emitted by the adjacent wavelength converter on the surface by surface plasmon resonance (SPR). Examples of the above-described metal particles may include gold, silver, platinum, copper particles, or the like, and a shape and size of the metal particles may be adjusted such that surface plasmon resonance may occur on the surface thereof.

Another aspect of the present invention may be a wavelength converting thin film prepared using the coating composition of the previous aspect.

A thickness of the wavelength converting thin film may be preferably in the range of 10 nm to 10 cm, more preferably in the range of 10 nm to 1 cm, and most preferably in the range of 100 nm to 500 μm. Content of the wavelength converter of the wavelength converting thin film may be in the range of 0.0001 to 50 wt %, preferably in the range of 0.001 to 20 wt %, more preferably in the range of 0.01 to 10 wt % with respect to a total weight of the wavelength converting thin film.

Transmittance of the wavelength converting thin film may be preferably 50% or more with respect to air, more preferably 60% or more, and most preferably 70% or more.

The coating composition (coating solution) is prepared by mixing the solvent, polysilazane, wavelength converter, and/or additive, and then treating them with ultrasonic waves, and the thin film may be formed by applying the coating composition prepared as described above onto the substrate, and then curing. Examples of the method of applying the coating composition onto a base material may include, but are not limited to, a non-vacuum thin film process such as a doctor blade coating method, a screen coating method, a spin coating method, a spray coating method, a paint coating method, or the like. As the base material, a solar cell may be used, and a plastic, stainless steel, glass, quartz, a fiber, or the like may also be used, but the base material is not limited thereto.

The thin film according to the present aspect may be configured as a plurality of layers. That is, a first thin film is formed using a coating solution having a first composition, and a second thin film is formed on the first thin film using a coating solution having a second composition which is different from the first composition.

The thin film according to the present aspect may be a thin film having a regularly arranged pattern. The pattern may have a thickness of several tens nanometers to several millimeters.

Further, a protective layer may be formed by coating the polysilazane solution which does not include the wavelength converter onto the thin film according to the present aspect. Accordingly, the lifetime of the wavelength converting thin film according to the present aspect may be improved.

Hereinafter, the present invention will be described in detail in conjunction with examples and comparative examples. However, the present invention is not limited thereto.

Examples 1 to 18

Preparation of Coating Composition 0.8 g of a perhydropolysilazane solution, and 3.2 g of dibutylether were added into a glass container, a wavelength converter and an additive with compositions shown in Table 1 were put into the glass container, the glass container was sealed, treated with ultrasonic waves in an ultrasound bath until a homogeneous solution was obtained, and thereby a coating composition was obtained.

TABLE 1

| | Composition of coating solution | | |
|---|---|---|---|
| | Wavelength converter 1 | Wavelength converter 2 | Additive |
| Example 1 | Coumarin 6, 0.0005 g | | |
| Example 2 | Rhodamine 6G, 0.001 g | | |
| Example 3 | Coumarin polymer, 0.001 g | | |
| Example 4 | Coumarin 6, 0.0005 g | Rhodamine 6G, 0.001 g | |
| Example 5 | Lumogen F Y083 0.0005 g | | |

TABLE 1-continued

| | Composition of coating solution | | |
|---|---|---|---|
| | Wavelength converter 1 | Wavelength converter 2 | Additive |
| Example 6 | Lumogen F Y083 0.0005 g | Lumogen F V570 0.0005 g | |
| Example 7 | Lumogen F Y083 0.0005 g | | TMBP 0.098 g |
| Example 8 | Lumogen F Y083 0.0005 g | | APTES 0.200 g |
| Example 9 | Lumogen F Y083 0.0005 g | | Gold nanoparticles (10 nm), 0.001 g, hexane 0.1 g |
| Example 10 | YAG yellow phosphor 0.01 g | | |
| Example 11 | Y2O3:Eu inorganic phosphor 0.01 g | YAG yellow phosphor 0.01 g | |
| Example 12 | ZnO light emitting nanoparticles 0.001 g | | |
| Example 13 | NaYF:Yb;Tm phosphor 0.01 g | | |
| Example 14 | Tb(thd)3 0.05 g | | |
| Example 15 | Eu(thd)3 0.05 g | | |
| Example 16 | CdSe 620 nm semiconductor nanoparticles 0.0005 g | | Hexane 0.1 g |
| Example 17 | CuInS$_2$/ZnS semiconductornanoparticles 0.0005 g | | Chloroform 0.1 g |
| Example 18 | Coumarin 6, 0.0005 g | CdSe 490 nm semiconductor-nanoparticles 0.0005 g | Chloroform 0.1 g |

Each material used in the examples is as follows.

As the polysilazane solution, a perhydropolysilazane polymer solution (DNF; product number: DNFMJ11) in which 20 wt % of the perhydropolysilazane having a molecular weight in the range of 6,000 to 8,000 was dissolved in dibutylether was used.

Figure 2:
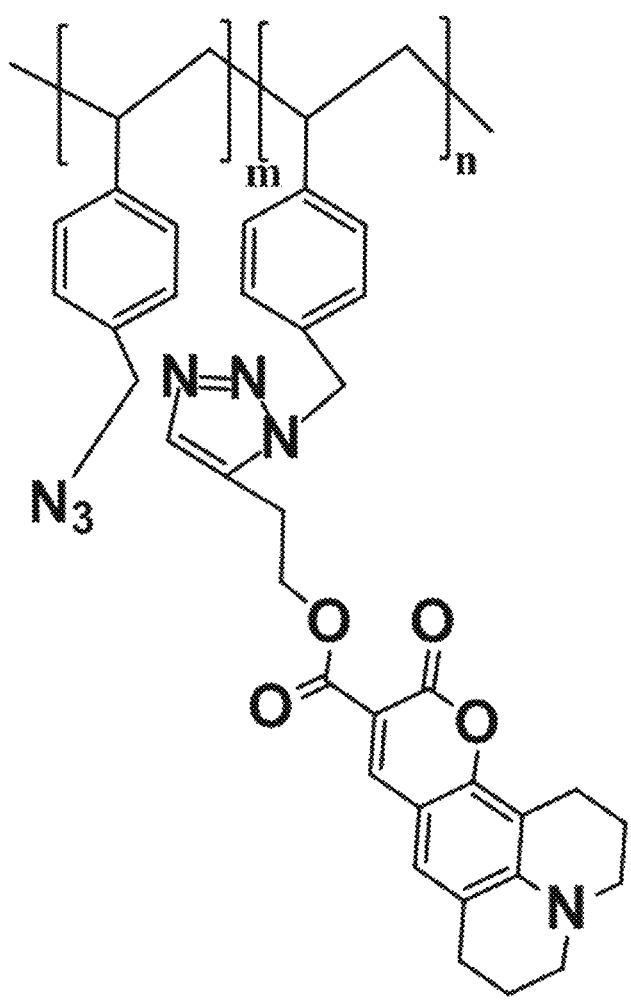
FIG. 2 shows a structural formula of a coumarin polymer used in Example 3.

As the organic light emitting material, coumarin 6 (Sigma-Aldrich Corporation; product number: 442631), rhodamine 6G (Sigma-Aldrich Corporation; product number: 83697), Lumogen F Y083 (BASF SE), and Lumogen F V570 (BASF SE) were purchased and used, and as the poly coumarin, a polymer having a chemical structure as shown in FIG. 2 was directly prepared and used.

As the semiconductor nanocrystals (or quantum dot), CdSe nanoparticles made by Nanosquare Co., Ltd. were used, and CuInS$_2$/ZnS semiconductor nanocrystals were directly prepared and used.

As the inorganic phosphor powders, $Y_2O_3$:Eu red phosphor (Sigma-Aldrich Corporation; product number: 756490) and YAG yellow phosphor (Daejoo Electronic Materials Co., Ltd.; product number: DLP-1217WY), and NaYF4:Yb;Tm up-converting phosphor (Sigma-Aldrich Corporation; product number: 756563) were purchased and used ($Y_2O_3$:Eu denotes that $Y_2O_3$ is a substance and Eu is a dopant, and it is the same format in the other phosphors).

As a supply source of a terbium ion ($Tb^{3+}$), terbium(III) tris(2,2,6,6-tetramethyl-3,5-heptanedionate (Sigma-Aldrich Corporation; product number 434051, hereinafter referred to as "Tb(thd)$_3$") was used, and as a supply source of an europium ion ($Eu^{3+}$), tris(2,2,6,6-tetramethyl-3,5-heptanediobato)europium(III) (TCI, product number T1265, hereinafter referred to as "Eu(thd)$_3$") was used.

Hexane, dibutylether, chloroform, and toluene which were products manufactured by Daejung Chemicals & Metals Co., Ltd., and had a purity of 99% or more were used.

As the additive, N,N'-trimethylenebis(1-methylpiperidine) (TMBP) and 3-aminopropyl(triethoxysilane) (APTES) were used.

As the metal particle additive, a gold nanoparticle colloid solution (Sigma, product number: G1527) having a diameter of 10 nm was purchased, and a solvent thereof was substituted with hexane to use.

Preparation of Wavelength Converting Thin Film

An edge of a glass substrate having a size of 1 cm×1 cm (product made by Knittel Glaser, thickness: 1.0 mm) was attached to Scotch tape (3M Company; Cat 122A), 200 µl of a coating solution including coumarin 6 of Example 1 from the coating solutions in Table 1 was dropped thereto, and evenly applied with the coating solution using a blade (Dorco Co. Ltd.). The prepared transparent thin film was treated with heat for 2 hours in an oven at 95° C., and thereby the transparent thin film which completed primary curing was prepared. Here, in order to promote curing, a dish with distilled water was put into the oven together with the thin film, and a relative humidity of 90% or more was maintained. The transparent thin film which completed primary curing was treated with heat in the oven at 150° C. for 2 hours, and thereby the transparent thin film which completed secondary curing was prepared. In a curing process, curing at a low temperature of 95° C. and curing at a high temperature of 150° C. may be sequentially performed as described above, and curing at a low temperature may be performed for a long time to induce complete curing, but when curing is performed at 150° C. or more from the beginning, the thin film may crack due to a rapid modification of the polysilazane.

Figure 3A:
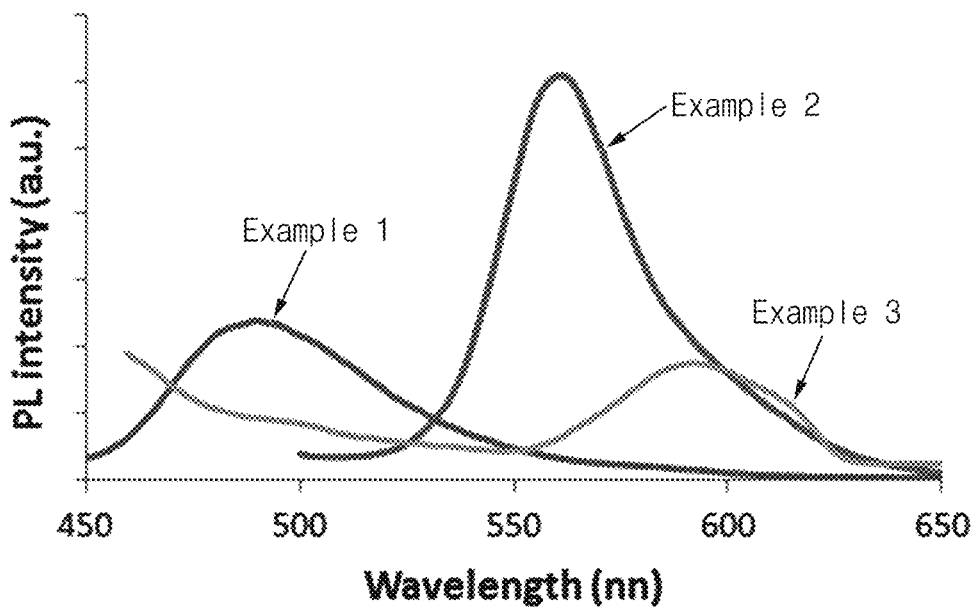
FIG. 3 shows graphs of a result of analyzing a light emitting spectrum with respect to wavelength converting thin films prepared with coating layers of Examples 1 to 18 (sequentially shown in FIGS. 3A to 3F).
Figure 3B:
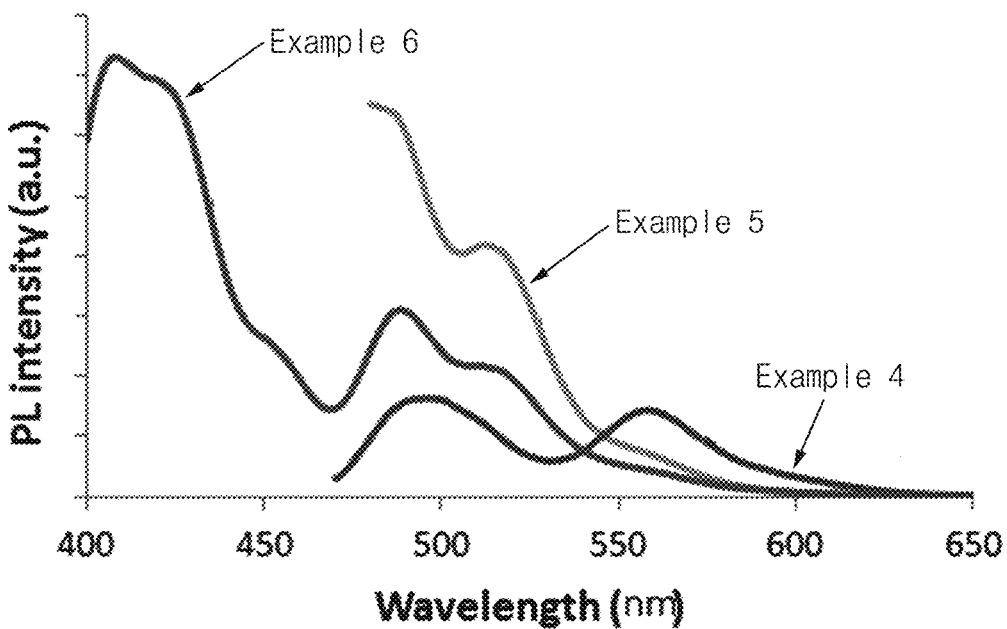
Figure 3C:
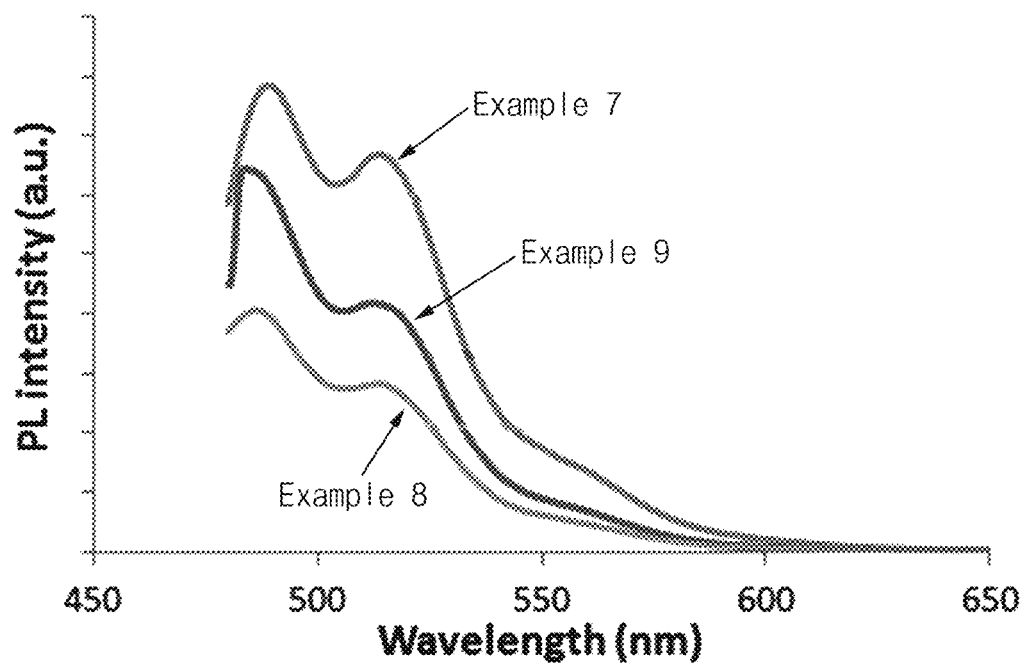
Figure 3D:
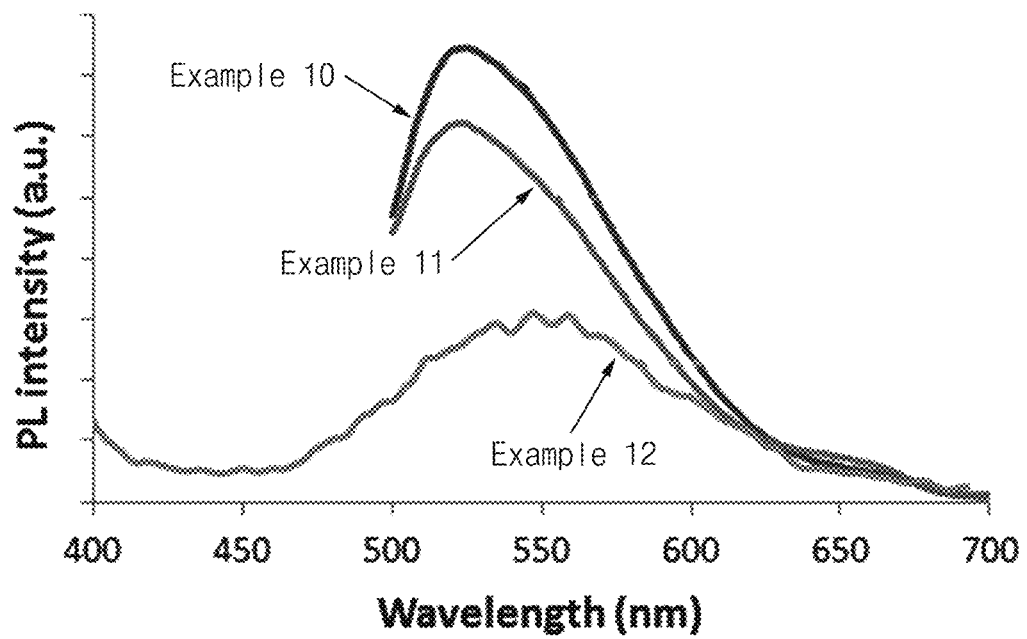
Figure 3E:
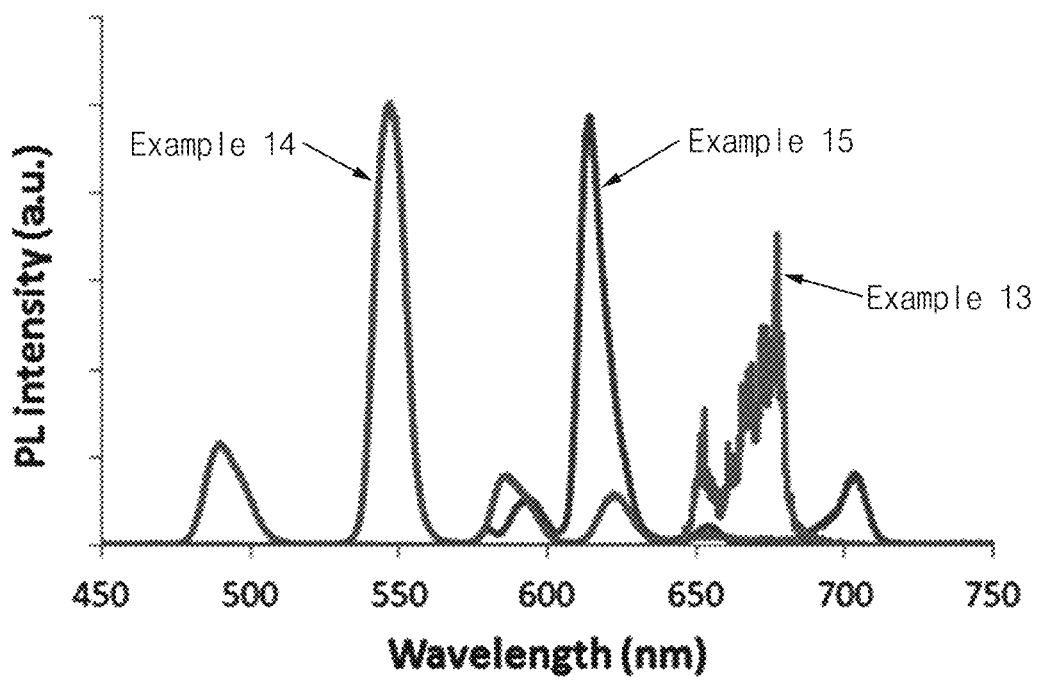
Figure 3F:
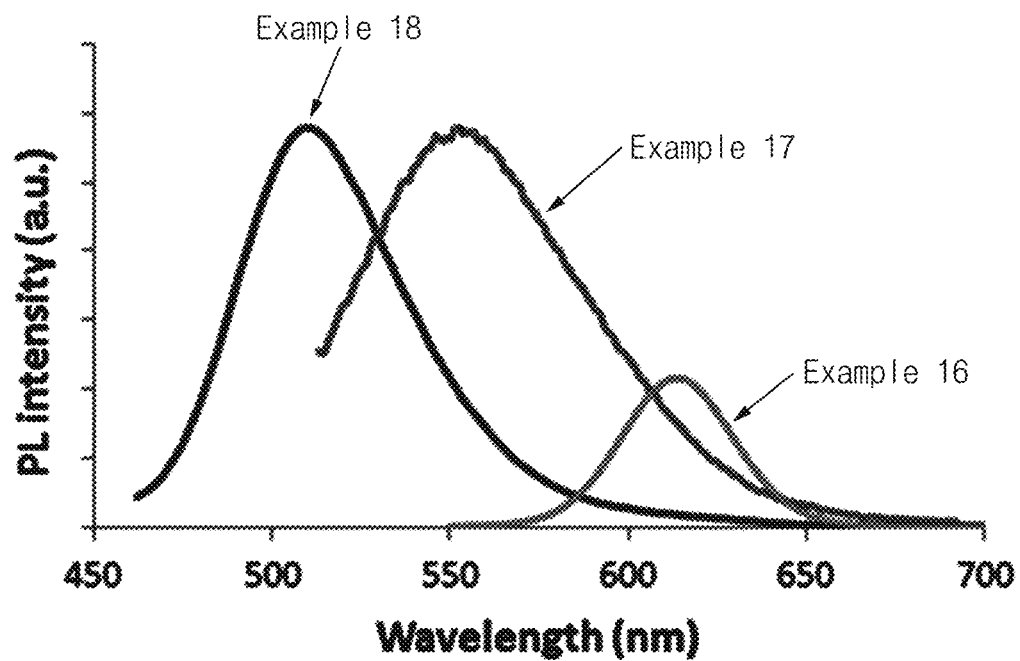

In order to determine photoluminescence properties of the wavelength converting thin film prepared using the coating solutions of Examples 1 to 18, a light emission spectrum analysis was performed on the thin film applied onto the glass substrate using a light emission spectrometer (PerkinElmer Inc.; a model name: LS50B). The analysis result of the coating solutions of Examples 1 to 18 was sequentially shown in FIG. 3 (FIGS. 3a to 3o. Here, a light source for optical excitation in the wavelength area ranging from 350 to 480 nm was used as a light source. From the result, it may be determined that different light emission spectra are obtained according to the photoluminescence properties of the wavelength converter.

Figure 4:
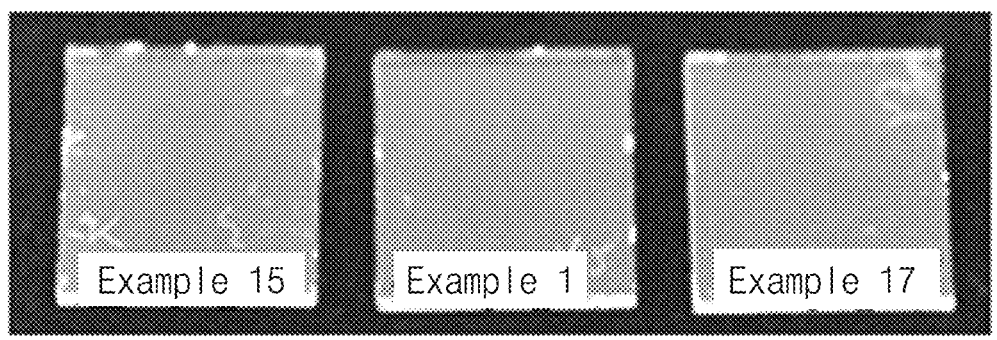
FIG. 4 shows pictures of thin films prepared with coating solutions of Examples 1, 15, and 17 under natural light and ultraviolet light.
Figure 4:
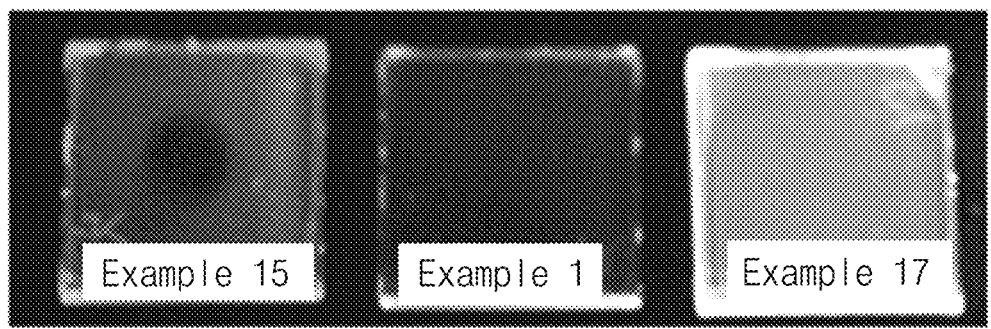

As a representative example therefrom, a picture of the thin film prepared using the coating solution of Examples 1, 15, and 17 under natural light and ultraviolet light (UV lamp (VilerberLourmat), 365 nm) was shown in FIG. 4.

Example 19

Figure 5:
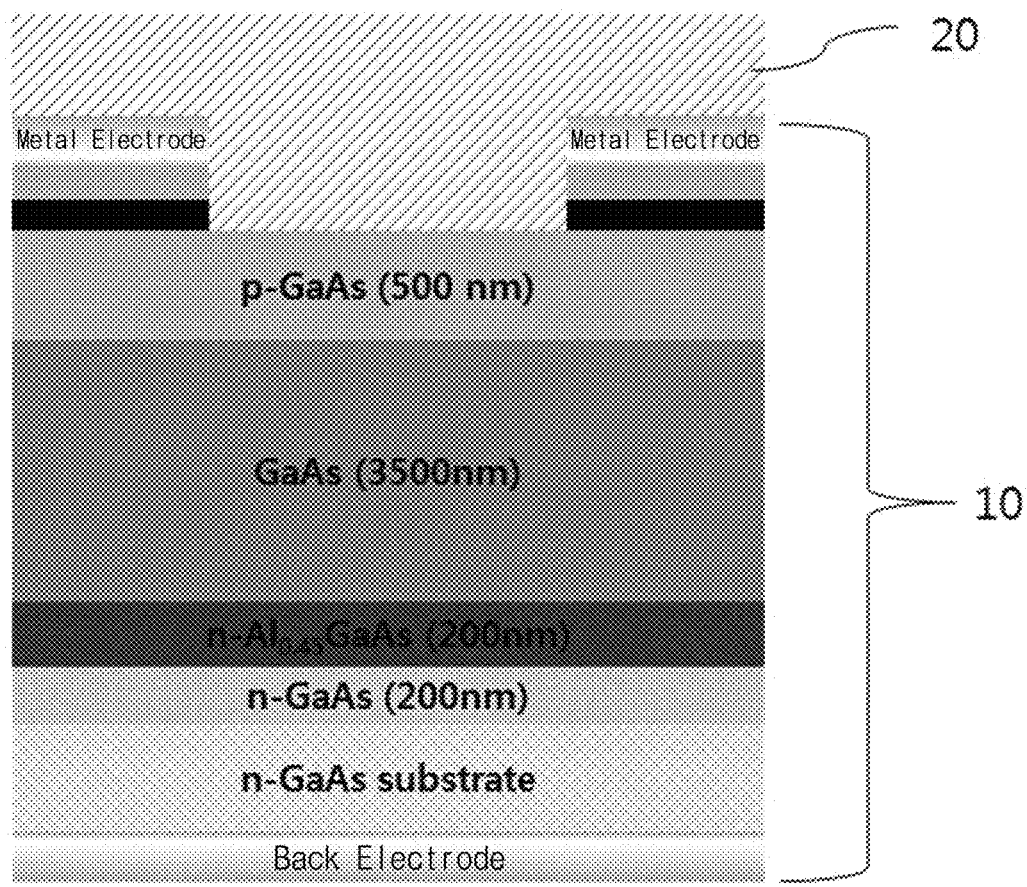
FIG. 5 is a cross-sectional view specifically showing an example in which the wavelength converting layer is applied to an upper surface part of a gallium arsenide solar cell.
Figure 6:
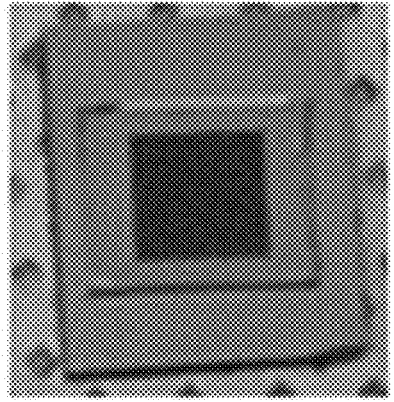
FIG. 6 shows pictures comparing before (a) and after (b) applying the wavelength converting layer to the gallium arsenide solar cell according to Example 19.
Figure 6:
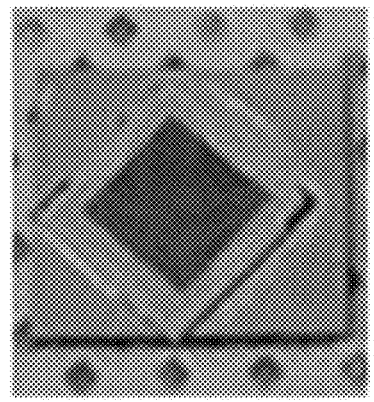

Manufacture of Solar Cell Including Silica-Based Inorganic Wavelength Converting Layer The wavelength converting layer was formed on an upper surface of a gallium arsenide (hereinafter referred to as GaAs) thin-film type solar cell having a size of 0.5 cm×0.5 cm using the coating solution of Example 1. The GaAs solar cell was obtained from Korea Advanced Nano Fab Center, and the structure thereof was configured as a back electrode layer, an n-GaAs layer, an n-Al$_{0.45}$GaAs layer, a GaAs layer, a p-GaAs layer, and a metal electrode layer, sequentially from a lower substrate. (as denoted by reference number 10 in FIG. 5.) In order to form the wavelength converting layer on the upper surface of solar cell, that is, the metal electrode layer (as denoted by reference number 20) using the coating solution including coumarin 6 of Example 1, after 50 µl of the coating solution was dropped onto the metal electrode layer, the coating solution was evenly applied using a blade (Dorco Co. Ltd.), and then dried at room temperature. The solar cell with the application of the coating solution was treated with heat in the oven at 95° C. for 2 hours. Here, in order to promote curing of the coating layer, the dish with distilled water was put into the oven together with the solar cell, and a relative humidity of 90% or more was maintained. Secondary curing of the wavelength converting layer was induced by the heat treatment in the oven at 150° C. Pictures of the GaAs solar cell not yet applied with the wavelength converting layer and the GaAs solar cell applied with the wavelength converting layer were respectively shown in FIGS. 6a and 6b.

Comparative Example 1

Preparation of Silica (TEOS) Coating Solution Including Wavelength Converter 0.0005 g of coumarin 6 was put into a dried glass container having a cap, 3.0 g of ethanol solution and 0.8 g of a TEOS crude liquid (tetraethyl orthosilicate)(Sigma-Aldrich Corporation; product number: 131903) was mixed to form a homogeneous solution, and then 0.2 g of distilled water was added thereto. The mixed solution was stirred in a bath at 80° C. for 3 hours, and thereby a silica-based coating solution was prepared.

Preparation of Silica Thin Film

The edge of the glass substrate having a size of 1 cm×1 cm×1.0 mm (product made by Knittel Glaser, thickness: 1.0 mm) was attached with a Scotch tape (3M Company; Cat 122A), 200 µl of the TEOS coating solution was dropped thereto, and evenly applied using a blade (Dorco Co. Ltd.). The prepared thin film was treated with heat in the oven at 95° C. for 24 hours, and thereby the cured silica thin film was prepared.

Comparative Example 2

Preparation of Silicon-Based Polymer (PDMS) Coating Solution Including Wavelength Converter A crude liquid of a PDMS coating solution (polydimethylsiloxane) (Dow Corning Corporation; Sylgard 184) and a curing liquid were mixed in the weight ratio of 10:1 and added to the dried glass container having a cap, a tetrahydrofuran solvent was added, and the mixed solution was diluted to 20 wt %. 0.0005 g of coumarin 6 was added to 4.0 g of the mixed solution, the mixed solution was treated with ultrasonic waves in the ultrasound bath until dissolution was completed, and thereby a silicon-based polymer coating solution containing coumarin 6 was prepared.

Preparation of Polymer (PDMS) Thin Film

The edge of the glass substrate having a size of 1 cm×1 cm (product made by Knittel Glaser, thickness: 1.0 mm) was attached with a Scotch tape (3M Company; Cat 122A), 200 µl of the PDMS coating solution was dropped thereto, and evenly applied using a blade (Dorco Co. Ltd.). The prepared thin film was treated with heat in the oven at 95° C. for 24 hours, and thereby the cured polymer thin film was prepared.

Property Evaluation of Thin Film

Figure 7:
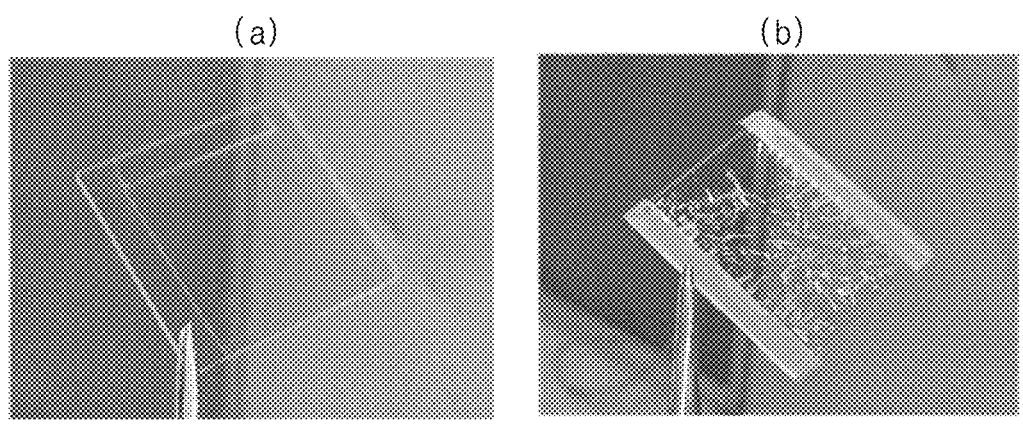
FIG. 7 shows pictures comparing a thin film formed by a coating solution of Example 1 with a thin film formed by a coating solution of Comparative Example 1.

Pictures of the thin film of Example 1 and the thin film of Comparative Example 1 were shown in FIG. 7 (Example 1:

FIG. 7a, Comparative Example 1: FIG. 7b). Referring to FIG. 7, in the case of the silica-based thin film of Comparative Example 1, significant cracking and peeling were generated due to a volume shrinkage of 50% or more in the process of curing the applied thin film, and accordingly, it may be determined that transmittance was decreased.

<Comparison of Photoluminescence Characteristics of Thin Film>

Figure 8:
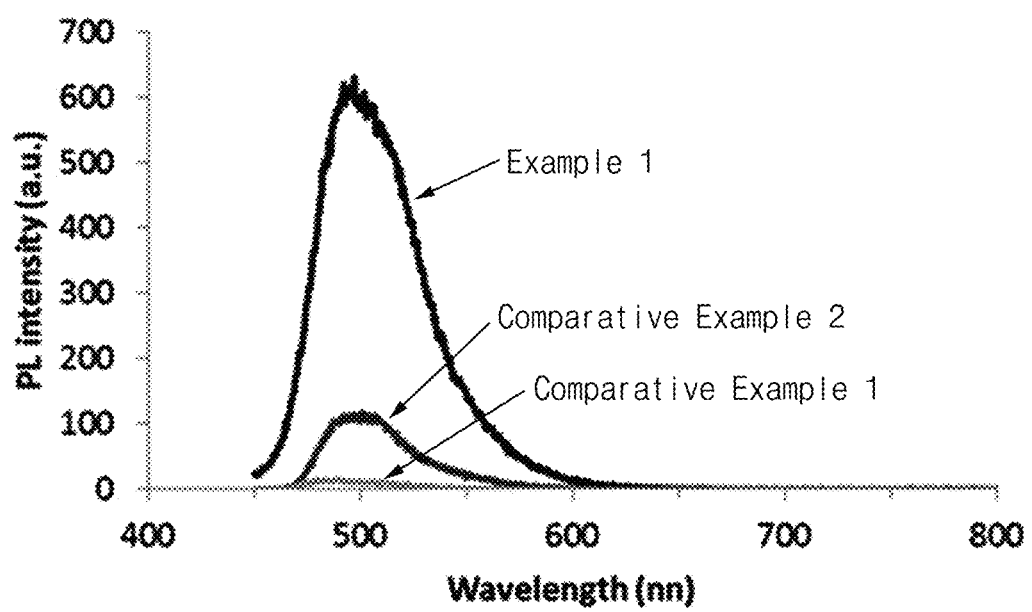
FIG. 8 shows a graph illustrating photoluminescence properties of the thin films of Example 1, Comparative Example 1, and Comparative Example 2.

Photoluminescence properties of the thin film of Example 1 and the films of Comparative Examples 1 and 2 were illustrated together in FIG. 8. Referring to FIG. 8, in the case of the thin film of Example 1, it may be determined that photoluminescence properties are about 50 times more excellent than that of Comparative Example 1 and about 6 times more excellent than that of Comparative Example 2.

<Photobleaching Characteristics of Thin Film>

Figure 9:
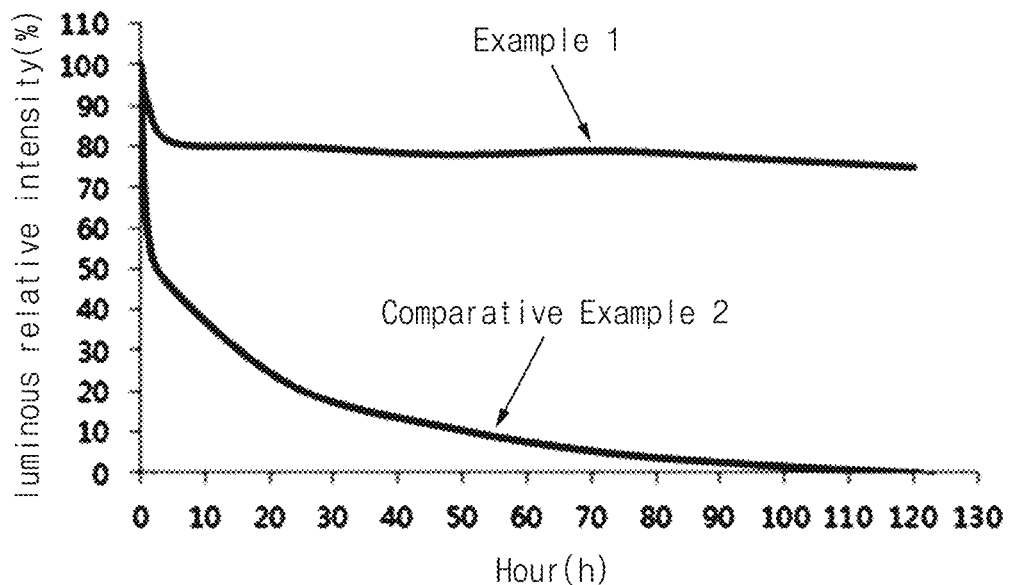
FIG. 9 shows a result of analyzing photo-degradation properties of the thin films of Example 1 and Comparative Example 2.

After the thin film of Example 1 and the thin film of Comparative Example 2 were exposed to visible light, a modification of the light emitting spectrum was observed to evaluate photobleaching characteristics (photobleaching characteristics of the thin film of Comparative Example 1 were difficult to be evaluated due to significant cracking and peeling as shown in FIG. 7). Each wavelength conversion thin film was positioned in a reactor equipped with a metal-halogen lamp (wavelength: 380 to 700 nm), and then was exposed to visible light. Light emitting intensity with the wavelength of 493 nm which corresponds to the λmax was measured over time, and the result thereof was illustrated in FIG. 9. Referring to FIG. 9, little photobleaching was generated on the thin film of Example 1, but in the case of the thin film of Comparative Example 2, photobleaching was continuously generated over time, and finally, the light emitting phenomenon was hardly shown after about 100 hours. In the case of Comparative Example 1, the evaluation of photobleaching was impossible due to significant cracking on the thin film.

[Evaluation of Effect of Wavelength Converting Layer]

Experimental Example 1

Figure 10:
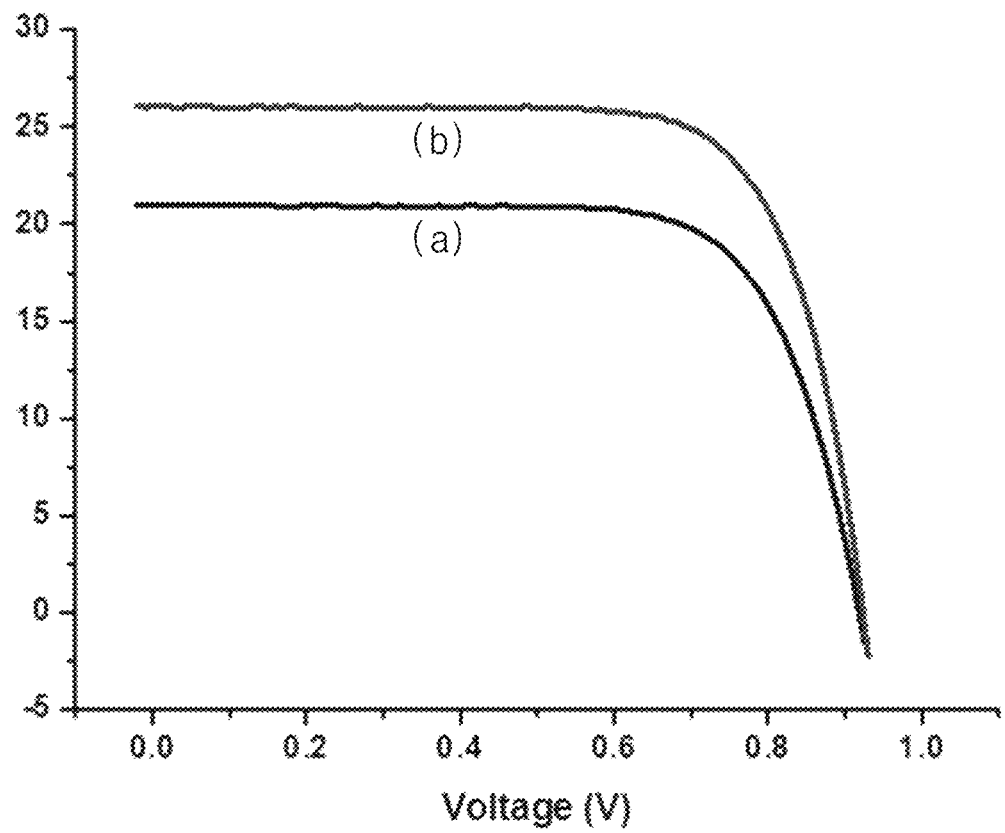
FIG. 10 shows a graph comparing current-voltage curves of the gallium arsenide solar cell before (a) and after (b) being applied with the wavelength converting layer.

With respect to the gallium-arsenide solar cell prepared in Example 19, energy conversion efficiency was measured, the current-voltage curve was measured to compare the solar cell not yet applied with the wavelength converting layer and the solar cell applied with the wavelength converting layer, and the results thereof were shown in FIG. 10. The measurement was performed by analyzing data of the current-voltage curve, and here, the simulation of the current-voltage curve was performed using a CHI660A electrochemical workstation (electrochemical spectroscopy (EIS)) which is widely used in the related field, and a 1000 W Xenon lamp (Thermo Oriel Instruments, USA) which is widely used during a measurement of the solar cell was used as an AM 1.5 Filter and artificial sunlight. Further, the results thereof were represented in the following Table 2.

TABLE 2

| | Current density Jsc (mA/cm$^2$) | Open circuit voltage (Voc (V)) | Fill factor | Energy conversion efficiency (%) |
| --- | --- | --- | --- | --- |
| GaAs solar cell | 21.23 | 0.925 | 0.729 | 14.02 |
| GaAs solar cell including wavelength converting layer according to Example 19 | 26.05 | 0.925 | 0.742 | 17.75 |

As a result, as shown in Table 1 and FIG. 10, when a photoelectric converting layer was applied with the solar cell, it was determined that the solar cell with the photoelectric converting layer showed a higher energy converting efficiency and a higher generated current value per unit area than the solar cell without the photoelectric converting layer.

Figure 11:
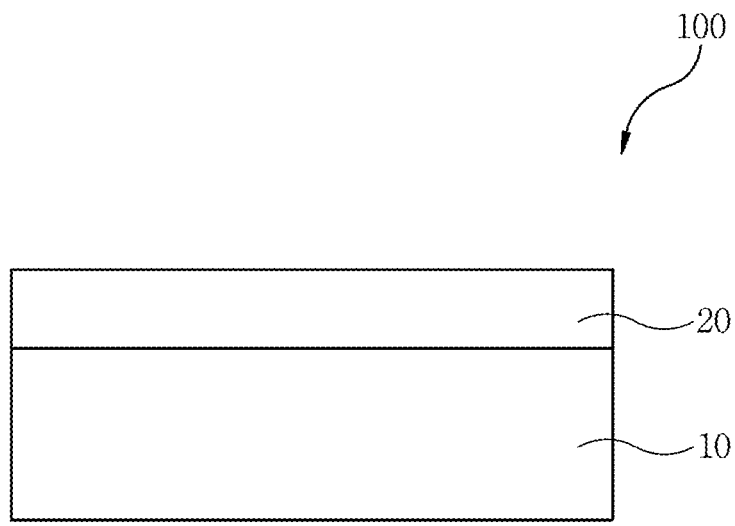
FIG. 11 is a cross-sectional view showing an example of the solar cell having the polysilazane-based wavelength converting layer formed by the coating solution according to the embodiment of the present invention.

FIG. 11 is a cross-sectional view showing an example of the solar cell having a silica-based inorganic wavelength converting layer according to the embodiment of the present invention.

Referring to FIG. 11, a solar cell 100 includes a cell 10, and a silica-based inorganic wavelength converting layer 20 formed by a coating solution containing a polysilazane and a wavelength converter on the upper surface of the cell 10, that is, a sunlight incident surface. Here, the wavelength converting layer 20 is a silica-based inorganic thin film which is formed by applying the coating solution containing the solvent, polysilazane and wavelength converter according to the embodiment of the present invention onto the cell 10 and then curing. Further, the wavelength converting sheet or thin film may be prepared through a separate manufacturing process, and then bonded to the cell 10 to form a wavelength converting layer 20.

The cell 10 may generate a current by absorbing incident light and forming holes and electrons. The cell 10 is based on, for example, an elemental semiconductor, a compound semiconductor, an organic semiconductor, or the like, and may have various structures. For example, as the cell 10, a silicon (Si)-based solar cell, a copper indium gallium selenium (CIGS)-based solar cell or a copper zinc tin sulfur (CZTS)-based solar cell, or gallium arsenide (GaAs) solar cell may be used.

The cell 10 may absorb and convert to current only light within a limited wavelength range, according to the material. For example, when the cell 10 includes single crystal silicon, the solar cell may mainly photoelectric-convert light in the short wavelength band of which the wavelength is in the range of 300 nm to 1,100 nm.

Further, the wavelength converting layer 20 converts light in the wavelength band which may not be absorbed by the cell 10 to light in the wavelength band which may be absorbed by the cell 10. As the above-described example, when the cell 10 is only capable of using light in the short wavelength band and is incapable of using light in the long wavelength band, the wavelength converting layer 20 includes the wavelength converter which may convert light in the long wavelength band to light in the short wavelength band.

Figure 12:
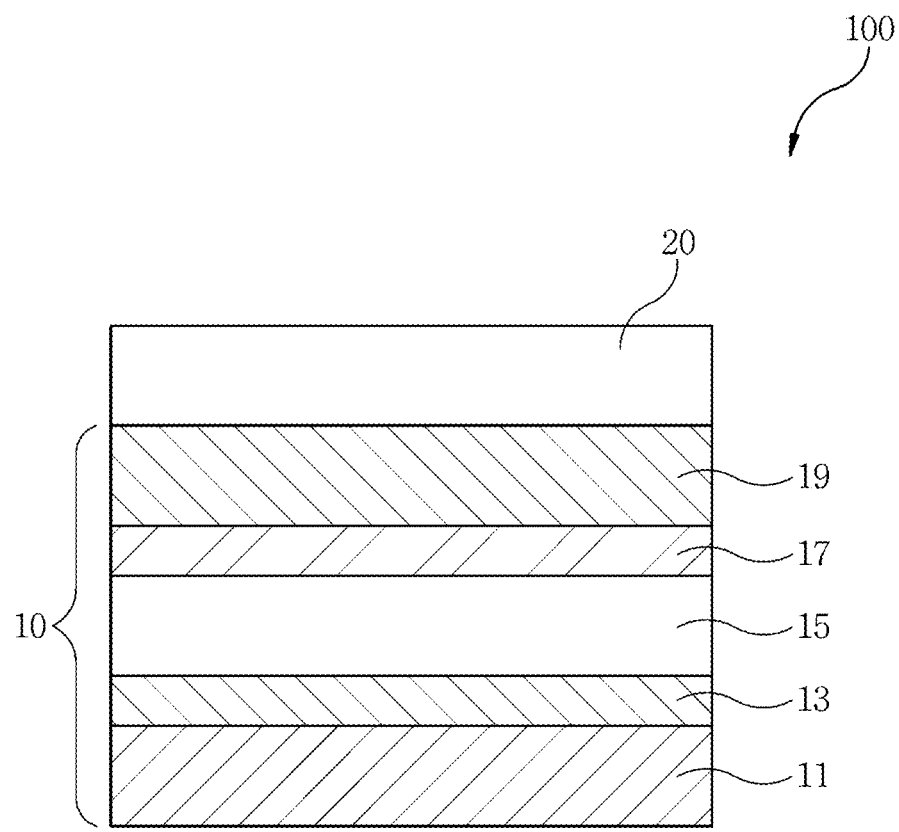
FIG. 12 is a cross-sectional view specifically showing a structure of the solar cell of FIG. 11.

The cell 10 according to the embodiment of the present invention may be realized as the structure illustrated in FIG. 12. Here, FIG. 12 is a cross-sectional view specifically showing the solar cell 100 of FIG. 11.

Referring to FIG. 12, the cell 10 includes a substrate 11, a back electrode layer 13, a light absorbing layer 15, a buffer layer 17, and a front electrode layer 19, and the wavelength converting layer 20 may be formed to cover the upper surface of the front electrode layer 19.

The substrate 11 may be selected from the group consisting of glass, a metal, a ceramic, and a polymer, but they are only examples, and the embodiment of the present invention is not limited to the above-described materials. Any material which may deposit molybdenum and may be used as the substrate of the solar cell may be selected without restrictions to physical/chemical properties and used.

The back electrode layer 13 is formed on the substrate 11. The back electrode layer 13 may be formed by depositing a metal material such as molybdenum (Mo) or the like on one surface of the substrate 11 using a sputtering deposition method. For example, the back electrode layer 13 may be formed using the sputtering deposition method in which electric power in the range of 30 to 100 watts is applied to molybdenum in an argon gas chamber at a pressure of about 1 to 10 mTorr. The back electrode layer 13 may be deposited with a thickness of about 1 μm on one surface of the substrate 11.

The light absorbing layer 15 is formed on the back electrode layer 13. Here, as a material of the light absorbing layer 15, a copper indium selenium (CIS)-based material, a copper indium gallium selenium (CIGS)-based material, or a copper zinc tin sulfur (CZTS)-based material may be used. The light absorbing layer 15 may be formed by applying the coating solution including the above material onto the back electrode layer 13, coating, and then treating with heat.

The buffer layer 17 is formed on the light absorbing layer 15. Here, the buffer layer 17 may include CdS, ZnS(O,OH), ZnSe, InS(O,OH), $In_2S_3$, $ZnIn_xSe_y$, $Zn_{1-x}Mg_xO$ ($0<x<1$, $0<y<1$, x and y are real numbers) or a mixture thereof, and may be formed using methods including a chemical bath deposition (CBD), an electron beam coating method, a sputtering method, and a chemical deposition method. For example, by depositing the substrate 11 provided with the back electrode layer 13 and the light absorbing layer 15 in a mixed solution in which cadmium sulfate ($CdSO_4$), ammonium hydroxide ($NH_4OH$), ammonium chloride ($NH_4Cl$), thiourea ($CS(NH_2)_2$) and superionic water are mixed, the buffer layer 17 may be deposited onto the light absorbing layer 15. Here, the buffer layer 17 may be deposited by heating the mixed solution to about 70° C., and the buffer layer 17 may be deposited with a thickness of about 50 nm on the light absorbing layer 15.

The above-described composition and formation method of the buffer layer 17 are merely examples, to realize or reproduce the embodiment of the present invention, those skilled in the art may select the composition and formation method of the buffer layer 17 without limitation, the embodiment of the present invention is not limited to the above-described composition and formation method, the process of separately forming the buffer layer 17 may be omitted by using the substrate 11 on which the buffer layer 17 is formed in advance, and the buffer layer 17 may not be prepared in some cases.

Further, the front electrode layer 19 is formed on the light absorbing layer 15 by means of the buffer layer 17. Here, an electrode layer of a transparent material may be used as the front electrode layer 19. That is, the front electrode layer 19 may include ZnO, AZO (aluminuim-doped zinc oxide), BZO (boron-doped zinc oxide), ITO (indium tin oxide), FTO (fluorinedoped tin oxide) or a mixture thereof, and may be formed using a method including the sputtering method.

The above-described composition and formation method of the front electrode layer 19 are merely examples, and to realize or reproduce the embodiment of the present invention, those skilled in the art may select the composition and formation method of the front electrode layer 19 without limitation. The embodiment of the present invention is not limited to the above-described composition and formation method of the front electrode layer 19, the process of separately forming the front electrode layer 19 may be omitted by using the substrate 11 on which the front electrode layer 19 is formed in advance, and the front electrode layer 19 may not be prepared in some cases.

The front electrode layer 19 may be formed as a single layer, and may be formed as multi-layers. For example, the front electrode layer 19 may include a first front electrode layer and a second front electrode layer. The first front electrode layer may be formed by depositing a metal such as zinc oxide (ZnO) or the like on the buffer layer 17 using a RF sputtering deposition method. The first front electrode layer may be deposited with a thickness of about 50 nm on the buffer layer 17. The second front electrode layer is formed on the first front electrode layer. The front electrode layer may be formed by depositing zinc oxide (ZnO) doped with aluminum oxide ($Al_2O_3$) on the first front electrode layer using a RF sputtering deposition method. The second front electrode layer may be deposited with a thickness of about 500 nm on the first front electrode layer.

The silica-based inorganic wavelength converting layer 20 formed of the coating solution containing the polysilazane and wavelength converter according to the embodiment of the present invention on the front electrode layer 19. The wavelength converting layer 20 may be formed on the front electrode layer 19 using a method as described above.

Further, in an example of the solar cell 100 including the wavelength converting layer 20 according to the embodiment of the present invention, the example of forming the wavelength converting layer 20 on the front electrode layer 19 of the solar cell 10 was disclosed, but it is not limited thereto. For example, as illustrated in FIG. 13, the wavelength converting layer 20 may be formed on the lower surface of the solar cell 10.

Figure 13:
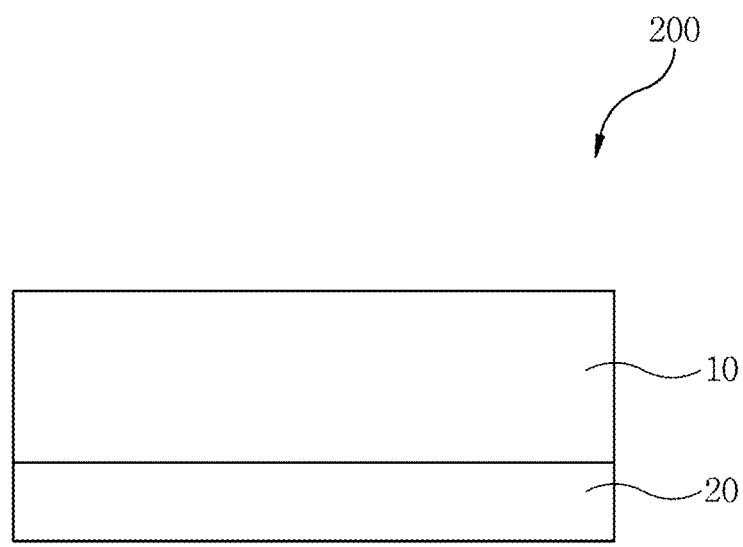
FIG. 13 is a cross-sectional view showing another example of the solar cell having the polysilazane-based wavelength converting layer formed by the coating solution according to the embodiment of the present invention.

FIG. 13 is a cross-sectional view showing another example of the solar cell 200 having the silica-based inorganic wavelength converting layer 20 formed of the coating solution containing the polysilazane and wavelength converter according to the embodiment of the present invention.

Referring to FIG. 13, the solar cell 200 includes the solar cell 10, and the wavelength converting layer 20 formed on the lower surface of the solar cell 10. Here, the wavelength converting layer 20 is formed by applying the coating solution containing the solvent, polysilazane and wavelength converter according to the embodiment of the present invention, and then curing.

The solar cell 10 may generate current by absorbing incident light and forming holes and electrons. The cell 10 is based on, for example, an elemental semiconductor, a compound semiconductor, an organic semiconductor, or the like, and may have various structures. For example, as the solar cell 10, a silicon (Si)-based cell, a copper indium gallium selenium (CIGS)-based cell or a copper zinc tin sulfur (CZTS)-based solar cell, or a gallium arsenide (GaAs) cell may be used.

Further, the wavelength converting layer 20 converts light in the wavelength band which may not be absorbed by the cell 10 to light in the wavelength band which may be absorbed by the cell 10. As the above-described example, when the cell 10 is only capable of using light in the short wavelength band and is incapable of using light in the long wavelength band, the wavelength converting layer 20 includes the wavelength converter which may convert light in the long wavelength band to light in the short wavelength band.

Here, a protective layer may be formed between the solar cell 10 and the wavelength converting layer 20. The protective layer may include a material capable of protecting the solar cell 10 (hereinafter, referred to as "protecting substance"), for example, at least one of $SiO_x$, $SiN_x$, and $Al_2O_3$. The protective layer may be formed as a separate layer as described above, and may be formed as one layer together with the wavelength converting layer 20. That is, the wavelength converting layer 20 may be formed by including the protecting substance in the coating solution forming the wavelength converting layer 20.

Further, a reflective layer may be further formed on the lower surface of the wavelength converting layer 20. The reflective layer may include a reflective material such as a metal or the like, and may reflect light not absorbed by the solar cell 10 and the wavelength converting layer 20 and passing therethrough, and light emitted from the wavelength converting layer 20 to the solar cell 10 side.

As described above, when the reflective layer is further formed, power generating efficiency of the solar cell may be further increased. Further, the reflective layer may be connected to the solar cell 10 and may also serve as the electrode.

Further, as the examples of the solar batteries 100 and 200 including the wavelength converting layer 20 according to the embodiment of the present invention, the example of forming the wavelength converting layer 20 on the upper or lower surface of the solar cell 10 was disclosed, but examples are not limited thereto. For example, the wavelength converting layer 20 may be formed inside of the solar cell 10. That is, the wavelength converting layer 20 may be formed between the light absorbing layer 15 and the buffer layer 17. Further, the wavelength converting layer 20 may be formed between the buffer layer 17 and the front electrode layer 19. Further, the wavelength converting layer 20 may be formed at two or more positions of a position between the light absorbing layer 15 and the buffer layer 17, a position between the buffer layer 17 and the front electrode layer 19, a position on the front electrode layer 19, and the lower surface of the substrate 11.

In addition, the examples shown in the present specification and the drawings are merely specific examples for ease the description, and it is not intended to limit the scope of the present invention. It is clear for those skilled in the art that other modified examples may be performed besides the examples disclosed herein.

According to the embodiment of the present invention, since the wavelength converting layer formed of the polysilazane allowing for low temperature sintering may be formed on the cell, a problem such as modification or cracking of components of the cell or the like may be suppressed.

The wavelength converting layer according to an embodiment of the present invention which is formed by a coating solution exhibits high visible light transmittance and has an advantage in that an application thereof on a surface of the cell is easy.

A coating layer formed on the surface of the cell with a polysilazane coating solution may be easily cured by an external stimulus such as heat, irradiation of light, an arrangement at room temperature, an injection of water, an injection of a catalyst, or the like to form the wavelength converting layer.

The wavelength converting layer formed of the polysilazane according to the embodiment of the present invention may protect the wavelength converter from oxidation, degradation, and whitening, suppress generation of yellowing even when being exposed to prolonged sunlight, and suppress a problem of gradually decreased transmittance. Accordingly, the wavelength converting layer according to the embodiment of the present invention may improve efficiency of the solar cell by converting the wavelength area incapable of contributing to a photoelectric effect to the wavelength capable of contributing to the photoelectric effect.

Further, the wavelength converting layer formed of the polysilazane according to the embodiment of the present invention exhibits properties such as high wear resistance, heat resistance, chemical resistance, oxidation resistance, etc.

Further, the wavelength converting layer formed by a post heat treatment after curing the coating layer formed by a coating solution including the polysilazane and wavelength converter may further improve transmittance, heat resistance, wear resistance, sealing and light emitting effects, etc.

What is claimed is:

1. A solar cell, comprising:
a cell; and
a plurality of wavelength converting layers comprising a wavelength converter, a silica-based material represented by the following Formula 1, a curing catalyst, a binder, and metal particles;

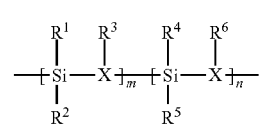

[Formula 1]

wherein m and n are integers in a range of 1 to 500, $R_1$, $R_2$, $R_4$ and $R_5$ are hydrogen, a methyl group, a vinyl group or a phenyl group, $R_3$ and $R_6$ are trimethylsilyl or alkoxysilylpropyl, X is oxygen or nitrogen, and wherein a ratio of nitrogen to oxygen is in a range of 0.00001:1 to 0.5:1,
wherein the cell comprises:
a substrate;
a back electrode layer disposed on the substrate;
a light absorbing layer disposed on the back electrode layer;
a buffer layer disposed on the light absorbing layer; and
a transparent front electrode layer disposed on the buffer layer, and
wherein the plurality of wavelength converting layers includes at least one first wavelength converting layer and at least one second wavelength converting layer, the at least one first wavelength converting layer being disposed on at least one of upper and lower surfaces of the cell, and the at least one second wavelength converting layer being disposed inside the cell between the transparent front electrode layer and the back electrode layer.

2. The solar cell of claim 1, wherein a content range of the wavelength converter in the wavelength converting layers may be one of ranges of 0.0001 to 50 wt %, 0.001 to 20 wt % and 0.01 to 10 wt % with respect to a total weight of the wavelength converting layer.

3. The solar cell of claim 1, wherein the wavelength converter comprises a lanthanide-based compound or a transition metal compound.

4. The solar cell of claim 3, wherein the lanthanide-based compound and transition metal compound comprises a nitric acid-based compound, a carbonic acid-based compound, a halogen-based compound, a sulfuric acid-based compound, an oxide-based compound, a phosphoric acid-based compound, an acetate-based compound, an acetoacetyl-based compound or a coordinate bonded organic compound-based compound.

5. The solar cell of claim 1, wherein the wavelength converter comprises an organic light emitting material.

6. The solar cell of claim 5, wherein the organic light emitting material comprises one or more types selected from the group consisting of an organic monomer including an aromatic, an alicyclic, an ether, a halogenated hydrocarbon, or a terpene functional group and a polymer thereof.

7. The solar cell of claim 1, wherein the wavelength converter comprises a semiconductor nanocrystal having a particle size in a range of 2 to 40 nm.

8. The solar cell of claim 7, wherein the semiconductor nanocrystal comprises one or more types selected from the group consisting of CdTe/CdSe, CdS(Se)/CdTe, CdS(Se)/ZnTe, CuInS(Se)/ZnS(Se), Cu(GaIn)S(Se)/ZnS(Se), ZnTe/CdS(Se), GaSb/GaAs, GaAs/GaSb, Ge/Si, Si/Ge, PbSe/PbTe, PbTe/PbSe, CdTe, CdSe, ZnTe, CuInS$_2$, CuGaS$_2$, Cu(Ga,In)S$_2$, CuGaSnS(Se), CuGaS(Se), CuSnS(Se), ZnS, CuInSe$_2$, CuGaSe$_2$, ZnSe, GaSb, GaAs, Ge, Si, PbTe, and PbSe.

9. The solar cell of claim 1, wherein the wavelength converter comprises an inorganic phosphor powder.

10. The solar cell of claim 9, wherein the inorganic phosphor powder comprises an oxide-based powder, a halogen-based powder, a nitrogen-based powder or a silicate-based powder.

11. The solar cell of claim 1, wherein a thickness of at least one of the plurality of wavelength converting layers is 50 nm or more.

12. The solar cell of claim 1, wherein the plurality of wavelength converting layers comprise at least two wavelength converting layers made from two compositions different from each other.

13. The solar cell of claim 1, wherein the ratio of nitrogen to oxygen in the silica-based material is controlled to the range of 0.00001:1 to 0.5:1 by heat-curing at a temperature of 200° C. or less.

14. A method of manufacturing the solar cell of claim 1, comprising:
preparing the cell; and
forming the plurality of wavelength converting layers, wherein each wavelength converting layer is formed by applying a coating solution comprising a solvent, a polysilazane, and the wavelength converter onto at least one surface of the cell, and curing the surface.

15. The method of claim 14, wherein each wavelength converting layer comprises the wavelength converter and a silica-based material represented by the following formula 1:

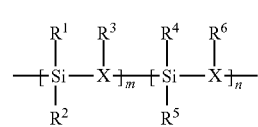
[Formula]

(m and n are integers in a range of 1 to 500, $R_1$, $R_2$, $R_4$ and $R_5$ are hydrogen, a methyl group, a vinyl group or a phenyl group, $R_3$ and $R_6$ are trimethylsilyl or alkoxysilylpropyl, X is oxygen or nitrogen, and nitrogen is in a range of 0.00001 to 0.5 times of oxygen), wherein the silica-based material is formed by oxidizing the polysilazane at a temperature of 200° C. or less, thereby allowing the concentration of nitrogen to be 0.00001 to 0.5 times that of oxygen.

16. The method of claim 14, wherein the solvent of the coating solution comprises a petroleum solvent, an aromatic solvent, an alicyclic solvent, ether, a halogenated hydrocarbon, a terpene mixture or a mixture thereof.

17. The method of claim 14, wherein the coating solution further comprises a curing catalyst, a binder, and metal particles, and total content of the curing catalyst, binder and metal particles is in the range of 0.0001 to 10 wt % with respect to the coating solution.

18. The method of claim 14, wherein in the forming of each wavelength converting layer, the curing is performed using a heating method, of light irradiating method, arranging at room temperature method, water injecting method, or a catalyst injecting method.

19. The method of claim 14, wherein the forming of each wavelength converting layer comprises:
forming a first thin film by applying a coating solution comprising a first composition, and curing the coating solution; and
forming a second thin film by applying a coating solution comprising a second composition which is different from the first composition onto the first thin film, and curing the coating solution.

20. The method of claim 19, wherein one of the first and second thin films comprises a regularly arranged pattern, and the regularly arranged pattern has a thickness in the range of several tens nanometers to several millimeters.

* * * * *